United States Patent
Eschwey et al.

(10) Patent No.: US 6,271,188 B1
(45) Date of Patent: Aug. 7, 2001

(54) PRODUCTION OF READY-TO-USE SOLUTIONS

(75) Inventors: Manfred Eschwey, Duesseldorf; Gerd Mainka, Bottrop; Walter Hub, München, all of (DE)

(73) Assignees: Messer Griesheim GmbH; Infineon Technologies Aktiengesellschaft, both of (DE)

( * ) Notice: Subject to any disclaimer, the term of this patent is extended or adjusted under 35 U.S.C. 154(b) by 0 days.

(21) Appl. No.: 09/371,164

(22) Filed: Aug. 10, 1999

(30) Foreign Application Priority Data

Aug. 14, 1998 (DE) ............................................. 198 37 041

(51) Int. Cl.⁷ .......................... H01L 21/00; H01L 21/306
(52) U.S. Cl. .......................... 510/175; 510/405; 510/435; 438/745
(58) Field of Search .................................. 510/175, 405, 510/435; 438/745

(56) References Cited

U.S. PATENT DOCUMENTS

| | | | |
|---|---|---|---|
| 5,261,966 | * 11/1993 | Mashimo et al. | 134/2 |
| 5,722,442 | * 3/1998 | Hoffman et al. | 134/102.1 |
| 5,746,993 | * 5/1998 | Mullee | 423/352 |
| 5,785,820 | * 7/1998 | Hoffman et al. | 202/158 |
| 5,795,492 | * 8/1998 | Reis et al. | 216/57 |
| 6,017,827 | * 1/2000 | Morgan et al. | 438/745 |
| 6,063,356 | * 5/2000 | Hoffman et al. | 423/483 |

FOREIGN PATENT DOCUMENTS

| | | |
|---|---|---|
| 699567 | * 12/1998 | (AU) . |
| 0782177 | * 7/1997 | (EP) . |
| 0846654 | 6/1998 | (EP) . |
| 0 915 060 | 5/1999 | (EP) . |
| 60153922 | 8/1985 | (JP) . |
| 11138182 | * 5/1999 | (JP) . |
| 11188374 | * 7/1999 | (JP) . |
| 96/39265 | * 12/1996 | (WO) . |
| 96/39266 | * 12/1996 | (WO) . |
| 98/08248 | * 2/1998 | (WO) . |

OTHER PUBLICATIONS

Chemical Abstracts, vol. 115, No. 11, 1991, Columbus, Ohio, abstract No. 113605n, Zsiga, Laszlo; Nag Jozsef: "Manufacture of ammonium hydroxide from liquid ammonia" XP000250756 & HU 54 943 A29, Apr. 19 (Apr. 29, 1991).

* cited by examiner

Primary Examiner—Lorna M. Douyon
(74) Attorney, Agent, or Firm—Connolly Bove Lodge & Hutz LLP

(57) ABSTRACT

The process for the direct preparation of cleaning solutions for semiconductor manufacture comprises producing the cleaning solutions directly at the site of use by mixing a gas with high-purity water, with a static mixer system being used. At least one of the gases $NH_3$, HCl, ozone or HF is added.

10 Claims, 2 Drawing Sheets

PRODUCTION OF READY-TO-USE SOLUTIONS

BACKGROUND OF THE INVENTION

This application is related to DE 198 37 041.5 filed on Aug. 14, 1998, which is incorporated by reference in its entirety for all purposes.

The invention relates to a process for preparing ready-to-use solutions by direct gas introduction.

A semiconductor factory is conventionally currently supplied with chemicals by delivery of chemicals, which are concentrated to a greater or lesser extent, mainly concentrated hydrochloric acid 36%, concentrated ammonia water 28% and concentrated hydrofluoric acid 40%, via tanker trucks or other suitable containers (up to 20 m$^3$). Generally, they serve for the preparation of cleaning solutions such as SC1 or SC2 (SC=standard clean). They are used for removing particulate, organic and metallic contaminants, which accumulate on the wafer surface during processing. These chemicals are distributed to the individual workplaces ("wet benches") via a central chemical supply system. This type of supply requires the use of a multiplicity of expensive chemical containers, combined with a high expenditure for installation, maintenance and quality assurance measures at the semiconductor manufacturer's and its suppliers etc., since the required specifications (anions, cations, organic impurities) vary within the lower ppb range. To solve these problems, most recently, there has been a conversion to generating on-site the concentrated chemicals for wafer cleaning. That is to say, from the corresponding gaseous anhydrides and high-purity water, the corresponding concentrated solution is produced directly by mixing in suitable processing apparatuses, generally trickle columns equipped with the appropriate accompanying units, such as pumps, heat exchangers etc.

A plant of this type for producing concentrated solutions is described in the company brochure "Turnkey Chemical Distribution System" from L'Air Liquide (distributed at Semicon '98).

The customary technique includes a number of disadvantages:

The concentrated solutions produced are highly corrosive and therefore highly susceptible to contamination.

The amounts of heat liberated during the dissolution of ammonia, hydrogen chloride or hydrogen fluoride in water must be dissipated.

To achieve the saturation end point, multistage absorption and cooling are generally necessary.

To achieve the purities required, high-purity gases must be used or technical quality grades must be further purified.

SUMMARY OF THE INVENTION

The object underlying the invention is to provide a process for preparing cleaning solutions for semiconductor manufacture, which process avoids said disadvantages.

In accordance with this invention a process for the direct preparation of cleaning solutions for semiconductor manufacture comprises generating the cleaning solutions directly at the site of use by mixing a gas with water or aqueous solutions, with a static mixing system being used.

THE DRAWINGS

DETAILED DESCRIPTION

It has been found that the abovementioned disadvantages can be overcome in a simple and elegant manner if the dilute cleaning solutions required in the semiconductor industry are produced directly on site (at the site of use) using a corrosion-resistant static mixer system (e.g. channels having internals, two-component nozzles or injector mixer), that is are produced directly shortly before entry into the process tank, from corresponding gaseous anhydrides by mixing with hydrogen peroxide and water.

The invention thus relates to a process for the direct preparation of cleaning solutions for semiconductor manufacture which comprises generating the cleaning solutions directly at the site of use by mixing a gas with water or aqueous solutions, with a static mixer system being used.

Preferably, high-purity water or high-purity aqueous solutions are used.

Cleaning solutions are produced by introducing a gas, preferably one of the gases $NH_3$, HCl, ozone or HF, into water or aqueous solutions. $NH_3$, HCl and HF are generally provided as compressed gas in pressurized gas vessels such as pressurized gas bottles. The gases can also be provided as a gas mixture, e.g. with an inert gas, such as nitrogen, for example hydrogen fluoride (HF) in nitrogen. The pressurized gas vessels containing the gases or gas mixtures serve as gas source. Ozone is generally prepared on site by an ozone generator which serves as ozone source. The gases are preferably used in high-purity form, in particular particle-free form.

Cleaning solutions based on aqueous ammonia solutions ($NH_3$ or $NH_4OH$), which generally comprise hydrogen peroxide ($H_2O_2$), are called below SC1 (SC=standard clean). Cleaning solutions based on aqueous hydrochloric acids (HCl), which generally comprise hydrogen peroxide ($H_2O_2$), are called below SC2 (SC=standard clean).

In the process of the invention, the highly concentrated, highly reactive intermediates are bypassed, proceeding directly to solutions which, in the case of SC1, comprise a max. 7% of by weight of $NH_3$ and, in the case of SC2, comprise a max. of 6% by weight of HCl. SC1 is, for example, an $NH_4OH/H_2O_2/H_2O$ solution, 1:1:5 (v/v/v). SC2 is, for example, an $HCl/H_2O_2/H_2O$ solution, 1:1:5 (v/v/v). To clean silicon wafers, they are treated, for example, in a first cleaning step with cleaning solution SC1 at 70° C., then, after removing SC1, are rinsed with water, treated in a second cleaning step with cleaning solution SC2 at 70° C. and then, after removing SC2, rinsed with water.

Hydrogen peroxide ($H_2O_2$) is used for the oxidation of organic impurities. Hydrogen peroxide can, under certain conditions, be replaced in the solutions by ozone ($O_3$) or used in combination with ozone. A block diagram of this procedure is shown in FIG. 1.

Figure 1:
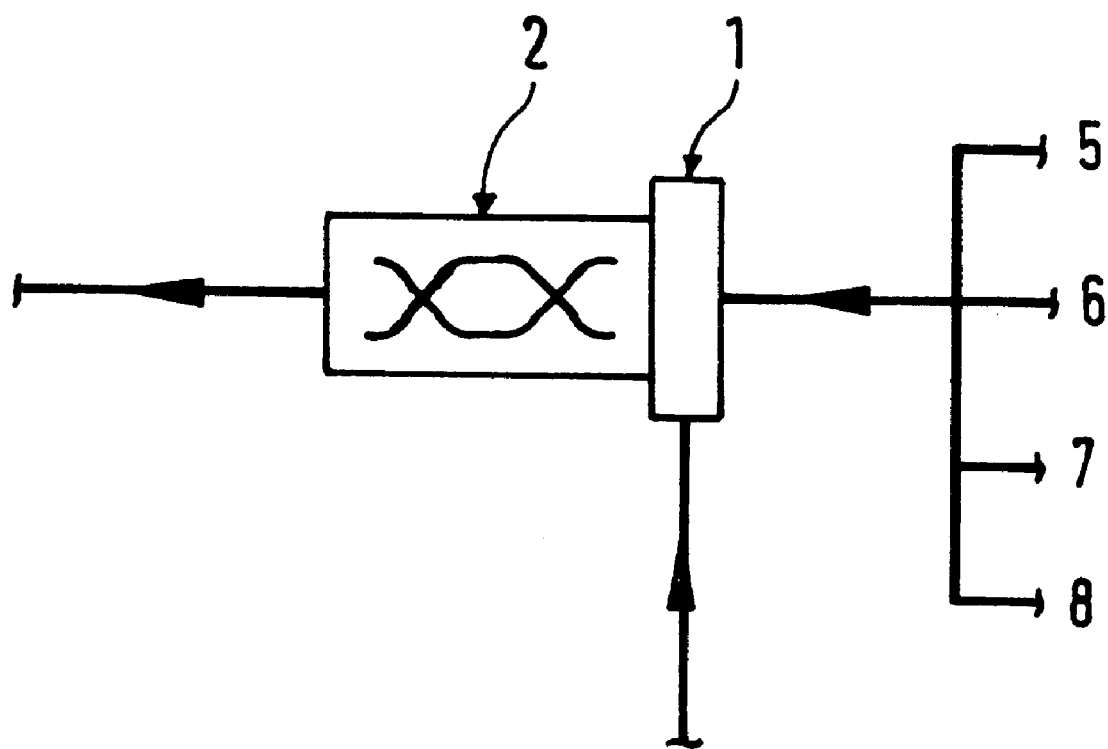
FIG. 1 is a diagrammatic representation of an apparatus for carrying out the process of the invention.

FIG. 1 shows a diagrammatic representation of an apparatus for carrying out the process of the invention for preparing a cleaning solution such as SC1 or SC2. $NH_3$ gas from an $NH_3$ gas source 3 (in the case of SC1 preparation) or HCl gas from an HCl gas source 4 (in the case of SC2 preparation), cold water 5, warm or hot water 6, hydrogen peroxide solution from hydrogen peroxide source 7 and/or ozone from ozone source 8 (optional; instead of hydrogen peroxide or in combination with hydrogen peroxide) are metered into an inlet chamber 1. The resultant crude mixture is passed from the inlet chamber 1 to the mixing chamber 2, which preferably contains a static mixer. In the mixing chamber 2, the mixture is homogenized. The finished mixture, that is the finished cleaning solution (e.g. SC1 or SC2), is taken off at outlet 9 (in the case of SC1 preparation)

or outlet 10 (in the case of SC2 preparation) and fed to the cleaning process.

A critical factor in synthesizing a reproducible, high-purity aqueous ammonia solution or hydrochloric acid solution for cleaning silicon wafers is the use of a corrosion-resistant mixer in combination with a likewise corrosion-resistant supply system for the media required. The materials listed in Table 1 have proved to be suitable materials.

TABLE 1

| SC1: | SC2: |
|---|---|
| Polymer materials | |
| Polytetrafluoroethylene (PTFE) | Polytetrafluoroethylene (PTFE) |
| Modified PTFE (TFM) | Perfluoroalkoxypolytetra-ethylene (PFA) |
| Perfluoroalkoxypolytetra-ethylene (PFA) | Polytrifluorochloroethylene (PCTFE) |
| Polytrifluorochloroethylene (PCTFE) | Polyvinyl chloride (PVC) |
| Tetrafluoroethylene-ethylene mixed polymers (ETFE) | Polypropylene (PP) |
| | Polyphenylene sulfide (PPS) |
| Polyvinyl difluoride (PVDF) | Polyethylene (PE) |
| Polypropylene (PP) | |
| Polyethylene (PE) | |
| Polyether ether ketone (PEEK) | |
| Polysulfones | |
| Polyamides | |
| Metallic materials | |
| Aluminum | Tantalum |
| Titanium | Chromium/nickel-based alloys |

Surprisingly, PVDF, the standard material for the ultra-clean sector, proved to be completely unsuitable, from long-term aspects, for producing SCI (because of decomposition reactions).

Figure 2:
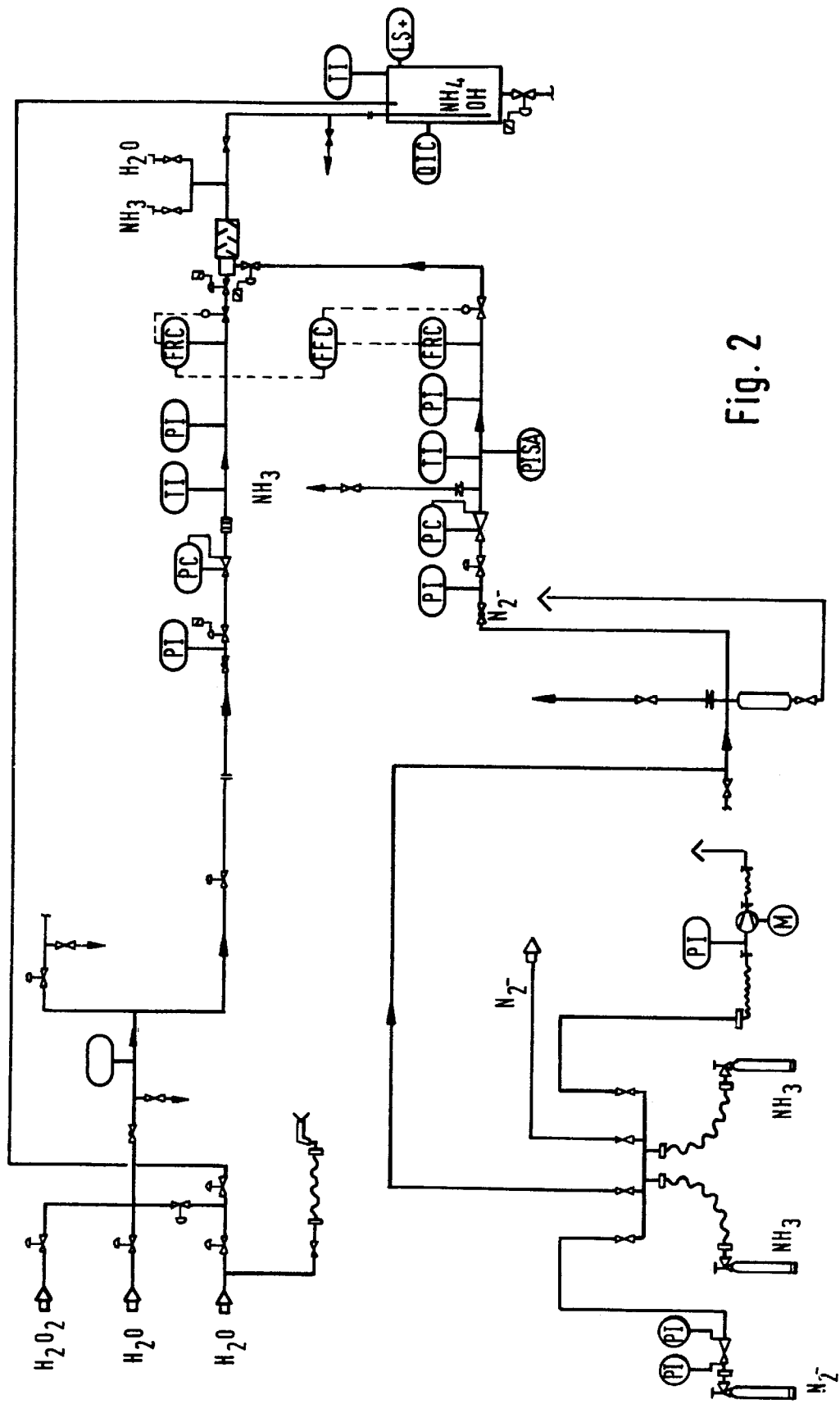
FIG. 2 is a structure of a test plant equipped with a mixing section consisting of a static mixer and the appropriate control and instrumentation elements.

The capability of the process was examined in a test plant equipped with a mixing section, consisting of a static mixer and the appropriate control and instrumentation elements made of materials listed in Table 1. The structure of the test plant can be seen in the diagram shown in FIG. 2.

The plant permits virtually any mixing ratio of $NH_3$ hydrogen peroxide and high-purity water to be prepared reproducibly (SC1). The control and instrumentation systems used correspond to the state of the art and serve for exact quantitative determination and for temperature control of the gas and liquid streams. The plant for SC2 is constructed in a completely similar manner, corresponding to the material recommendations in Table 1. The resultant solutions were analyzed by a mass spectrometer whose inlet is connected to an inductively excited plasma burner. This what is termed ICP-MS system permits limits of detection which vary around 100 ppt for most impurities. It is the standard method for analyzing metals in the ultratrace range. The results are summarized in Table 2 below.

TABLE 2

| $NH_3$ concentration in % by weight | 0.34 | 0.33* | 2.27 | 2.31* | 3.94 | 3.89* |
|---|---|---|---|---|---|---|
| Element | Concentration in ppb | | | | | |
| Cr | 0.0421 | 0.0543 | 0.0764 | 0.0984 | 0.1013 | 0.1285 |
| Mn | 0.0286 | 0.0321 | 0.0432 | 0.0594 | 0.0697 | 0.1855 |

TABLE 2-continued

| $NH_3$ concentration in % by weight | 0.34 | 0.33* | 2.27 | 2.31* | 3.94 | 3.89* |
|---|---|---|---|---|---|---|
| Fe | 0.4060 | 0.9764 | 1.0987 | 1.3422 | 1.2227 | 1.8466 |
| Ni | 0.0976 | 0.1743 | 0.1987 | 0.3567 | 0.2142 | 0.7406 |
| Cu | 0.1709 | 0.1763 | 0.2985 | 0.7639 | 0.3721 | 0.9823 |

*Reference sample: Prepared from 28% $NH_3$ aq (electronic grade) by dilution with high-purity water In the interpretation of these results, it must be noted that the decrease in concentration is not in a linear relationship with the dilution. Rather, under conditions of practice (ultratrace range) it is dependent in a complex manner on dynamic equilibrium states owing to surface adsorbates. However, it is not difficult to see that the contamination loading in the course of producing SC1 solution via direct introduction of gas is markedly lower compared with processes practiced hitherto. Together with the disadvantages described at the outset in the preparation of cleaning solutions in a wafer factory, this novel process, owing to the reduction in chemical use, offers a number of ecological and economic advantages to the semiconductor manufacturer.

List of Designations
Inlet chamber
Mixing chamber equipped with static mixer
$NH_3$ gas source
HCl gas source
Cold water
Warm or hot water
Hydrogen peroxide source (e.g. 30% strength solution)
Ozone source (e.g. ozone generator)
Outlet of SC1
Outlet of SC2

What is claimed is:

1. A process for the direct preparation of cleaning solutions for semiconductor manufacture which comprises generating the cleaning solutions directly at the site of use by mixing at least one of the gases selected from the group consisting of $NH_3$, HCl and HF with water or aqueous solutions, wherein the gas or gases to be added are metered into an inlet chamber and the resultant crude mixture is passed from the inlet chamber to a mixing chamber, which contains a static mixer, where the mixture is homogenized.

2. The process as claimed in claim 1, wherein at least one gas is metered into the water or aqueous solutions.

3. The process as claimed in claim 1, wherein the cleaning solutions prepared are dilute ready-to-use solutions.

4. The process as claimed in claim 3, wherein the water or the aqueous solution used is of high purity.

5. The process as claimed in claim 4, wherein the static mixer consists of at least one corrosion-resistant material.

6. The process as claimed in claim 5, wherein the static mixer and the parts or surface thereof coming into contact with the gas are selected from the group consisting of polytetrafluoroethylene (PTFE), perfluoroalkoxypolytetra-ethylene (PFA), polytrifluorochloroethylene (PCTFE), tetrafluoroethylene-ethylene mixed polymers (ETFE), polyvinyl chloride (PVC), polypropylene (PP), polyvinyl difluoride (PVDF), polyphenylene sulfide (PPS), polyethylene (PE), polyether ether ketone (PEEK), polysulfones, polyamides, aluminum, tantalum, titanium and a chromium/nickel-based alloy.

7. The process as claimed in claim 1, wherein the water or the aqueous solution used is of high purity.

8. The process as claimed in claim 1, wherein the static mixer consists of at least one corrosion-resistant material.

9. The process as claimed in claim 1, wherein the static mixer and the parts or surface thereof coming into contact with the gas are selected from the group consisting of polytetrafluoroethylene (PTFE), perfluoroalkoxypolytetraethylene (PFA), polytrifluorochloroethylene (PCTFE), tetrafluoroethylene-ethylene mixed polymers (ETFE), polyvinyl chloride (PVC), polypropylene (PP), polyvinyl difluoride (PVDF), polyphenylene sulfide (PPS), polyethylene (PE), polyether ether ketone (PEEK), polysulfones, polyamides, aluminum, tantalum, titanium and a chromium/nickel-based alloy.

10. The process as claimed in claim 1, wherein the cleaning solutions are prepared by admixing ozone to the gas.

\* \* \* \* \*